United States Patent
Drobnik

(10) Patent No.: US 9,673,692 B2
(45) Date of Patent: Jun. 6, 2017

(54) APPLICATION OF NORMALLY CLOSED POWER SEMICONDUCTOR DEVICES

(71) Applicant: Josef C. Drobnik, Mesa, AZ (US)

(72) Inventor: Josef C. Drobnik, Mesa, AZ (US)

(73) Assignee: NXP USA, INC., Austin, TX (US)

( * ) Notice: Subject to any disclaimer, the term of this patent is extended or adjusted under 35 U.S.C. 154(b) by 563 days.

(21) Appl. No.: 13/835,911

(22) Filed: Mar. 15, 2013

(65) Prior Publication Data

US 2014/0281638 A1    Sep. 18, 2014

(51) Int. Cl.
| | |
|---|---|
| H02M 1/32 | (2007.01) |
| H02M 1/08 | (2006.01) |
| H02M 3/156 | (2006.01) |
| H02M 7/5387 | (2007.01) |
| H02M 1/00 | (2006.01) |
| H03K 17/687 | (2006.01) |

(52) U.S. Cl.
CPC .............. *H02M 1/32* (2013.01); *H02M 1/08* (2013.01); *H02M 3/156* (2013.01); *H02M 7/5387* (2013.01); *H02M 2001/0006* (2013.01); *H03K 2017/6875* (2013.01)

(58) Field of Classification Search
CPC .............. H02M 3/28; H02M 3/33507; H02M 3/33569; H02M 3/33561; H02M 3/156; H02M 3/33592; H02M 3/3376; H02M 3/337; H02M 3/33523; H02M 3/335; H02M 3/33538; H02M 3/33515; H02M 3/33576; H02M 3/33546; H02M 3/1584; H02M 3/157; H02M 3/3384
USPC ................. 363/21.01, 21.04–21.11, 125–127, 363/131–134
See application file for complete search history.

(56) References Cited

U.S. PATENT DOCUMENTS

| | | | |
|---|---|---|---|
| 5,103,387 A * | 4/1992 | Rosenbaum et al. | 363/21.13 |
| 5,315,533 A * | 5/1994 | Stich et al. | 700/298 |
| 7,602,228 B2 | 10/2009 | Mazzola et al. | |
| 8,203,377 B2 | 6/2012 | Kelley et al. | |
| 2007/0147099 A1* | 6/2007 | Tai et al. | 363/131 |
| 2008/0117653 A1* | 5/2008 | Saito | 363/20 |
| 2009/0057869 A1 | 3/2009 | Hebert et al. | |

(Continued)

OTHER PUBLICATIONS

"HF Gate Drive Circuit for a Normally-On SiC JFET with Inherent Safety", by Tsuguhiro Takuno, Takashi Hikihara, Takashi Tsuno, and Satoshi Hatsukawa, Power Electronics and Applications, 2009. EPE '09. 13th European Conference, Barcelona, pp. 1-4, E-ISBN : 978-90-75815-13-9, Print ISBN: 978-1-4244-4432-8, Sep. 8-10 2009.

*Primary Examiner* — Jue Zhang
*Assistant Examiner* — Kevin H Sprenger

(57) ABSTRACT

A power source delivers power from a main power source using switching by a normally on transistor. A driver switches on and off the normally on transistor under a control signal by a controller during regular operation. A housekeeping power supply delivers auxiliary power to the driver. The driver switches off the normally on transistor during irregular operation. Irregular operation occurs at least when the control signal is absent or no auxiliary power is available or during transients such a power up or down. Bridge block pairs thereof can be arranged to form a half bridge power switch, an H bridge switch, a three phase bridge switch, a multi-phase switch, a buck converter, a buck-boost converter, or a boost converter.

20 Claims, 12 Drawing Sheets

(56) References Cited

U.S. PATENT DOCUMENTS

| | | |
|---|---|---|
| 2012/0218011 A1 | 8/2012 | Kelley et al. |
| 2013/0127431 A1* | 5/2013 | Ansari .......................... 323/282 |
| 2013/0242620 A1* | 9/2013 | Hosotani .................... 363/21.09 |
| 2014/0232187 A1* | 8/2014 | Ryan et al. ..................... 307/23 |

* cited by examiner

| | AUXILIARY POWER OK? | REGULAR POWER OK? | CONTROL SIGNAL OK? |
|---|---|---|---|
| NO ACTION | 0 | 0 | 0 |
| GATE = CONTROL SIGNAL | 1 | 0 | 1 |
| GATE = CONTROL SIGNAL | 0 | 1 | 1 |
| ACTIVATE GATE | 0 | 1 | 0 |
| ACTIVATE GATE | 1 | 1 | 0 |
| GATE = CONTROL SIGNAL | 1 | 1 | 1 |
| ACTIVATE GATE | 0 | 0 | 1 |
| ACTIVATE GATE | 1 | 0 | 0 |

FIG. 11

APPLICATION OF NORMALLY CLOSED POWER SEMICONDUCTOR DEVICES

BACKGROUND OF THE INVENTIONS

1. Technical Field

The present inventions relate to control for normally closed power semiconductor devices and, more particularly, relate to power supplies having normally closed power semiconductor devices.

2. Description of the Related Art

Most of the power semiconductors used for power conversion and processing are normally open (normally off). By normally off, when a normally off power semiconductor is not energized, no current will flow through it. This property lends itself to safe operation because if a control signal is not present, the power semiconductor doesn't conduct electricity.

In contrast, normally closed (normally on) devices, such as certain SiC or GaN, are on without being energized. Consequently in order to keep the power device off the control signal must be present. In most power conversion topologies, the power semiconductor device must be in off state when the main power is applied. A similar rule applies for the shutdown: the device must be kept activated until the main power source is removed. This introduces substantial problems to the power designer.

The present invention is illustrated by way of example and is not limited by the accompanying figures, in which like references indicate similar elements. Elements in the figures are illustrated for simplicity and clarity and have not necessarily been drawn to scale.

The details of the preferred embodiments will be more readily understood from the following detailed description when read in conjunction with the accompanying drawings wherein:

BRIEF DESCRIPTION OF THE DRAWINGS

FIG. 11 illustrates a truth table demonstrating action of the driver according to one embodiment of the present inventions.

The details of the preferred embodiments will be more readily understood from the following detailed description when read in conjunction with the accompanying drawings wherein:

DETAILED DESCRIPTION OF THE PREFERRED EMBODIMENTS

Figure 1:
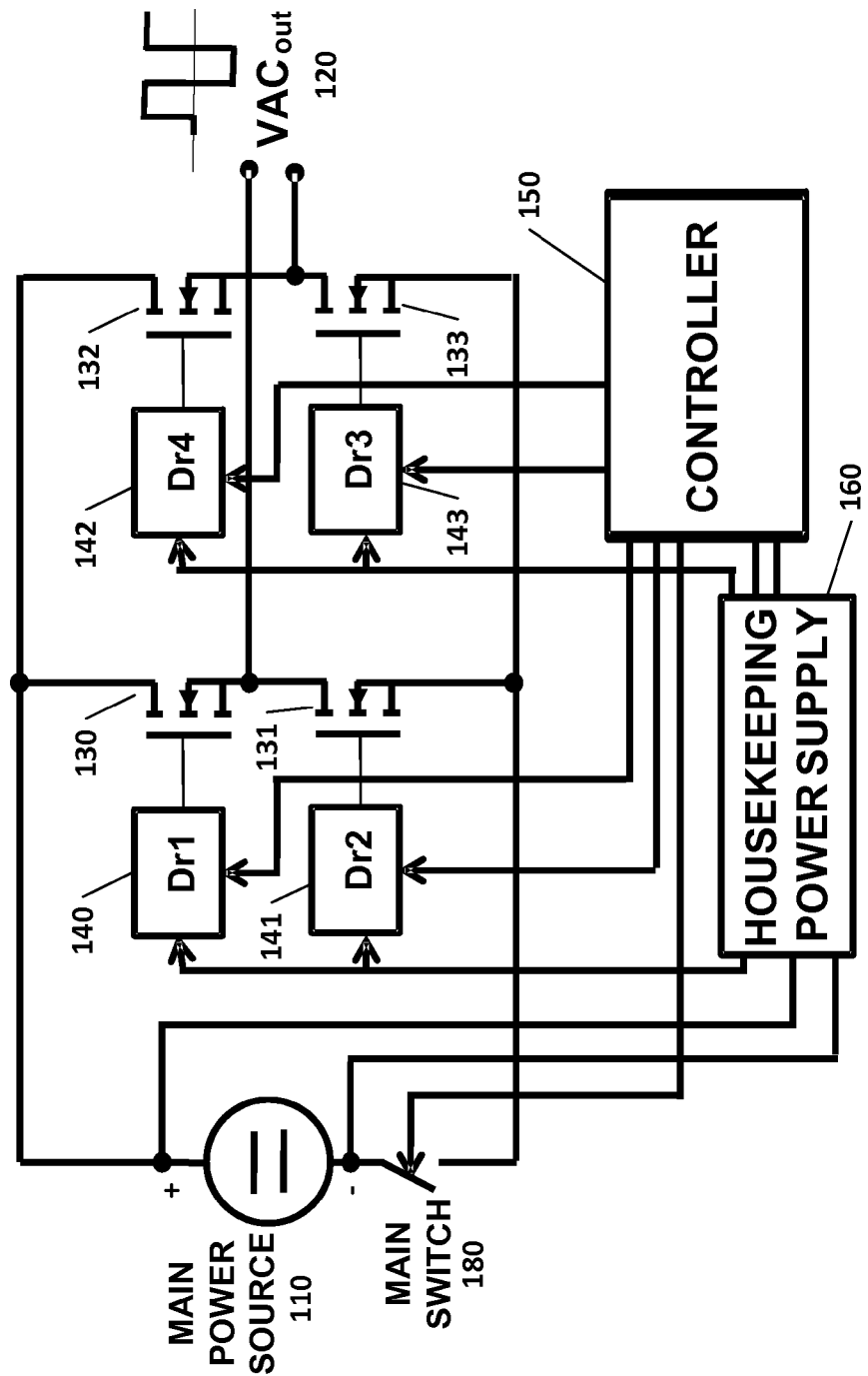
FIG. 1 illustrates a schematic diagram of a normally on four transistor switch for a supply according to one embodiment of the present inventions.

FIG. 1 illustrates a schematic block diagram of a normally on, four transistor switch for a supply according to one embodiment of the present inventions. A power supply is illustrated in FIG. 1 for delivering power to an output 120. A main power source 110 supplies DC input power. Normally on transistors 130-133 are coupled to the main power source 110 to switchably deliver power to an output 120. The normally on transistors 130-133 are typically of a semiconductor material type that causes them to be normally on. Examples of normally on semiconductor materials that are used for normally on transistors include of SiC, GaN, diamond semiconductors and others. The power at output 120 is an alternating current power VAC.

The normally on transistors 130-133 illustrated in FIG. 1 are a normally on transistor 130 and a normally on transistor 131 in series with the normally on transistor 130 and a normally on transistor 132 and a normally on transistor 133 in series. The output 120 is derived from a node between the normally on transistors 130-131 and another node between the normally on transistors 132-133.

Drivers 140-143 are coupled to respective of the normally on transistors 130-133. These drivers switch off and on the normally on transistors 130-133. Because the transistors 130-133 are normally on, they need to be driven to an off switch state. The drivers 140-143 are designed to accommodate normally on transistors. Certain behavior is built into each driver to cause it to switch its associated the transistor based on conditions which will be described. This way both desired operation and safety is achieved.

The drivers 130-133 illustrated in FIG. 1 are a driver 140 coupled to the controller 150 and a housekeeping power supply 160 for switching control of the normally on transistor 130, a driver 141 coupled to the controller 150 and the housekeeping power supply 160 for switching control of the normally on transistor 131, a driver 142 coupled to the controller 150 and the housekeeping power supply 160 for switching control of the normally on transistor 132, and a driver 143 in series with the driver 142 and coupled to the controller 150 and the housekeeping power supply 160 for switching control of the normally on transistor 133. The housekeeping power supply can be referred to as a secondary power supply and typically in embodiments and a faster response time then a main power supply.

The normally on transistors 130-133 and drivers 130-133 in the embodiment of FIG. 1 are in an H bridge configuration. The normally on transistors and drivers in alternate embodiments can be in configurations different than an H bridge such as a 3-phase bridge configuration or a half bridge configuration. The normally on transistors and drivers in alternate embodiments can also be in configurations such as a boost, buck-boost or buck power supply configuration. These alternate configurations will be described later with respect to other, alternate embodiments illustrated in other drawings.

A controller 150 is coupled to drivers 140-143 to control the switching of the normally on transistors 130-133 by the drivers 140-143 during regular operation. During transients, such as power on and power off, the controller 150 is unable to deliver a good control signal. One reason is the controller 150 is unable to decide the state of the circuit as a whole due to incomplete measurements. Another reason is that the controller does not have sufficient power to be able to operate.

Figure 2:
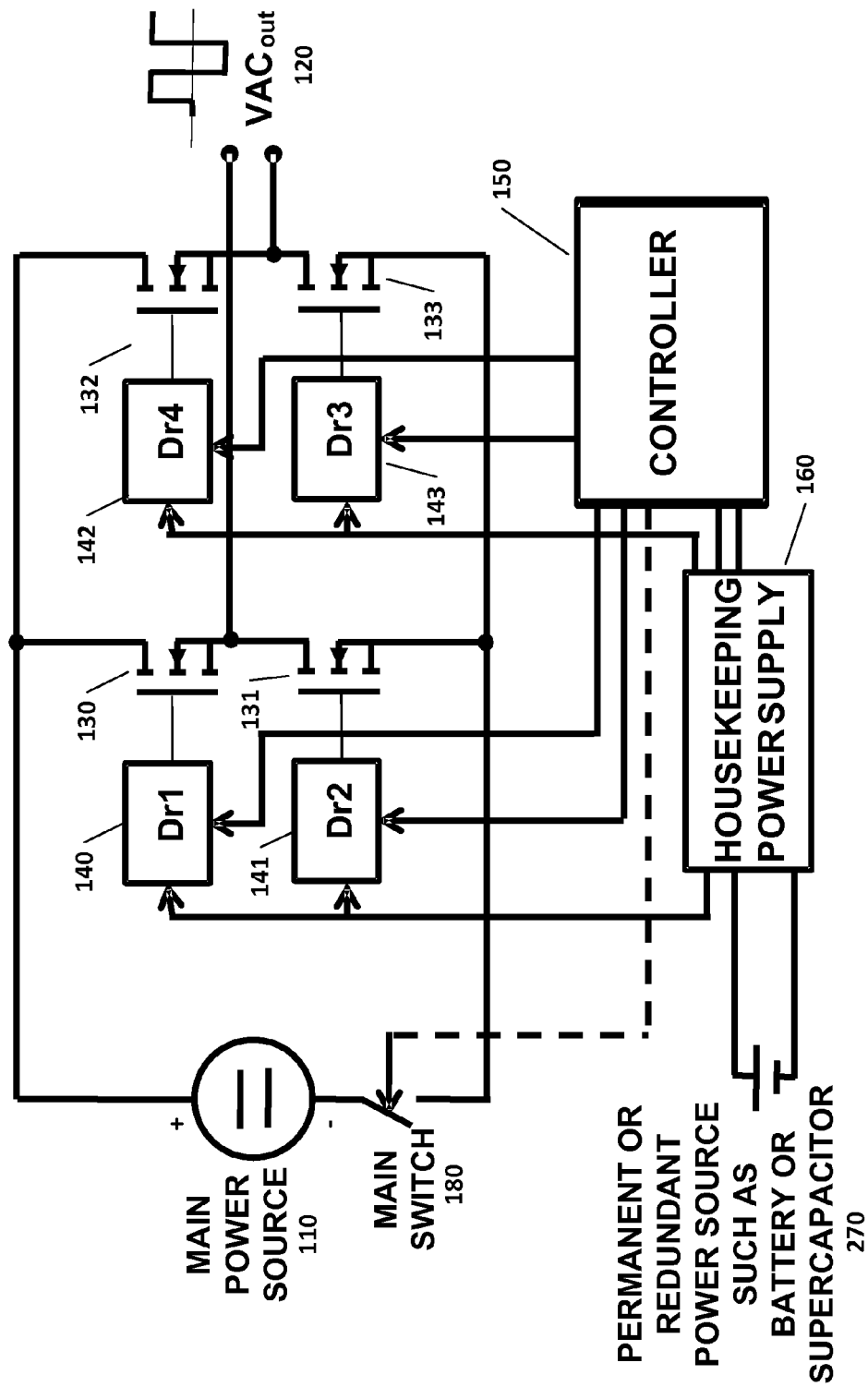
FIG. 2 illustrates a schematic diagram of a normally on four transistor switch for a power supply with independent power according to one embodiment of the present inventions.

A housekeeping power supply 160 is operatively coupled to the drivers 140-143 to deliver auxiliary power to the drivers 140-143. The housekeeping power supply 160 obtains power more steadily and more quickly that the power typically made available to the controller. This way, during transients, the drivers 140-143 are powered by the housekeeping power supply 160 using the auxiliary power. This auxiliary power can be derived by the housekeeping power supply 160 in ways internally or from batteries. As illustrated in the embodiment of FIG. 2, the auxiliary power is derived from the main power source 110.

The drivers 140-143 switch on and off the normally on transistors 130-133 during regular operation based on the control signals from controller 150. The drivers 140-143 switch off the normally on transistors 130-133 during irregular operation. The drivers 140-143 thus directly protect the normally on transistors 130-133 during the irregular operation. Examples of irregular operation include fault conditions and transients, such as power on and power off. Examples of fault conditions include 1) overcurrent in a normally on transistor, 2) a short circuit such as an overcurrent at the output or input of the converter, 3) an under voltage, 4) an overvoltage, or 5) a malfunction of the controller. During any of these fault conditions, the driver activates the gate of the normally on transistors. As an immediate consequence the normally on transistor is turned off preventing damage to itself or the converter.

One example of irregular operation occurs at least when the control signal is absent or no auxiliary power is available. A driver 140-143 senses these conditions and accordingly controls the gate of its normally on transistor 130-133 so that the normally on transistor 130-133 goes off.

In addition to the above described use of drivers for protection, a circuit may also have additional protections such as fuses and power off switching. One example is a main switch 180 of FIG. 1 coupled in series with the main power source 110 for additionally disconnecting the main power source 110 under control of the controller 150 upon a fault condition.

Power to the controller 150 and the drivers 140-143 is supplied before power from the main power source 110 is available to the normally on transistors 130-133. Power to the controller 150 and the drivers 140-143 is always present until the main power source 110 is fully depleted on power down.

FIG. 2 illustrates a schematic block diagram of a normally on, four transistor switch for a power supply with independent power according to one embodiment of the present inventions. The housekeeping power supply 160 is coupled to a permanent or redundant power source 270 such as a battery to redundantly power the housekeeping power supply 160 separate from the main power source 110. As an alternative to a battery, the permanent or redundant power source 270 can be a supercapacitor to redundantly power the housekeeping power supply 160 separate from the main power source 110.

One embodiment is an application of the schematic block diagram of FIG. 2 to an electric or hybrid automobile. In such an exemplary electric or hybrid vehicle embodiment, the main power source 110 can be a large high capacity and often high voltage lithium or other battery used to power the vehicle drivetrain and the permanent or redundant power source 270 can be a 12 volt or other lead-acid battery normally used for on-board engine electronics such as engine controllers and auto body components such as radio entertainment and lighting.

Figure 3:
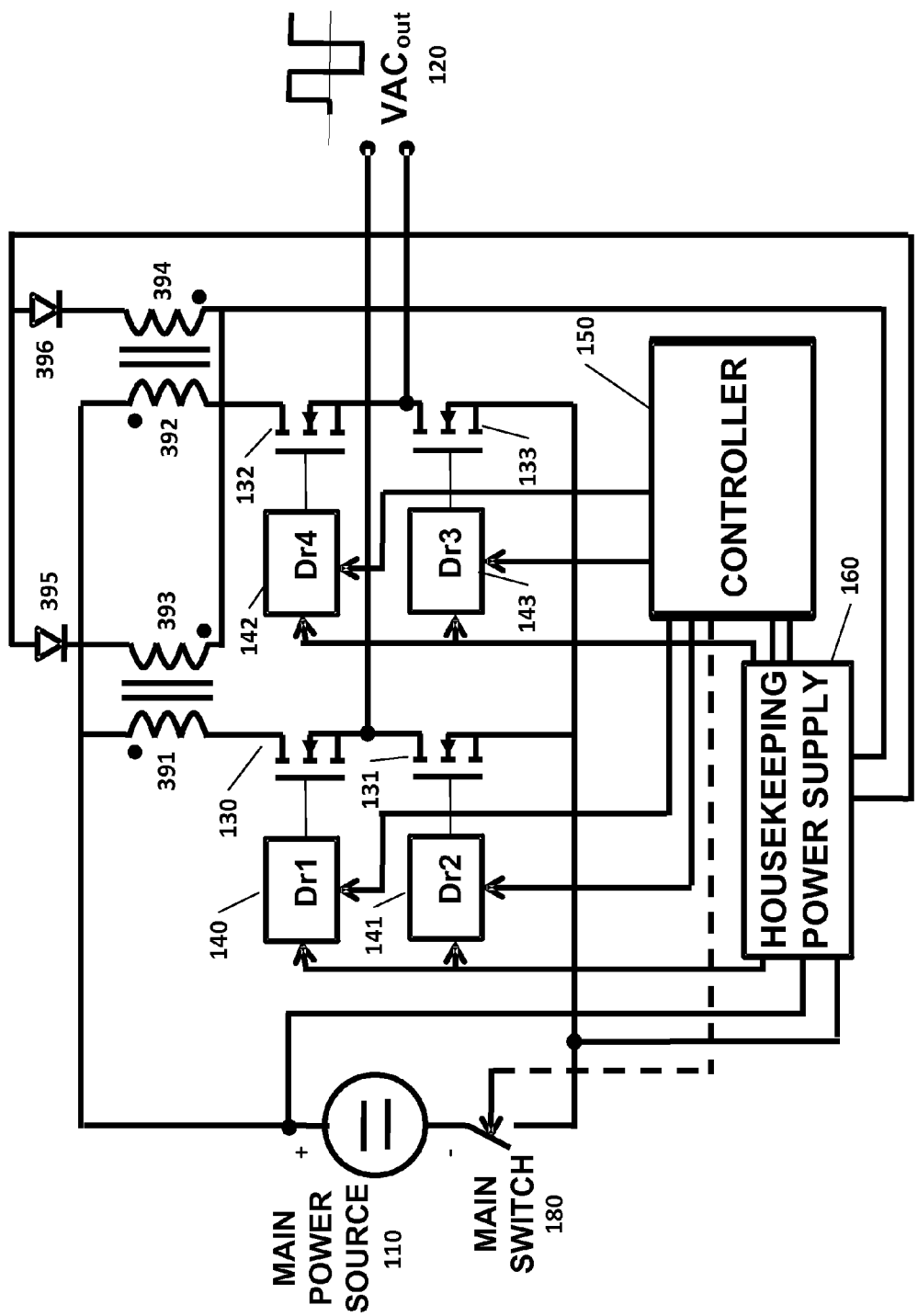
FIG. 3 illustrates a schematic diagram of a normally on four transistor switch for a power supply with redundantly derived power according to one embodiment of the present inventions.

FIG. 3 illustrates a schematic block diagram of a normally on, four transistor switch of an H bridge for a power supply with redundantly derived power according to one embodiment of the present inventions. The housekeeping power supply 160 is coupled to a permanent or redundant power source such as an in-circuit transformer or inductors 393-394 to redundantly power the housekeeping power supply 160 separate from the main power source 110. The redundant power source of inductors 393-394 has primary inductors 391-392 in series with a respective normally on transistor 130-133. Secondary inductors 393-394 are magnetically coupled to the primary inductors 391-392 and coupled to the housekeeping power supply 160 to redundantly serve as a power source to power the housekeeping power supply 160 and the drivers 140-143 during a transition condition such as a startup of the system. Rectifier diodes 395-396 are in series with the secondary inductors 393-394 to redundantly provide a DC power source to the housekeeping power supply 160 and the driver 140-143 during irregular operation, such as the transients during startup or power down of the system.

The main switch 180 is connected in series with the main power source 110 and controlled by the controller. Since the housekeeping power supply 160 has an independent power source, the main switch 180 is optional and can be omitted or just replaced with a fuse. During the time when an output from the H bridge is not required, the gates of the normally on transistors 130-133 may remain active so that the normally on transistors are off. Consequently the main switch 180 may be in an on position all the time or may even not be present.

The power source for the housekeeping power supply 160 is an interruptible power source. As soon as the main power source 110 is activated, the housekeeping power supply 160 requires certain finite time before it is able to produce the output voltage necessary to operate the gates of the normally on transistors 130-133. During this period of time, all normally on transistors 130-133 are in an on state. This would produce an undesirable shoot-through in the H bridge. Therefore inductors 391 and 392 are placed between the collector and positive supply line of the normally on transistors 130-133. When the main power source 110 is applied, current starts to flow through each vertical branch of the H bridge as well as through the primary inductor of the inductors 391 and 392. Consequently a voltage is generated in the secondary inductor of the inductors 393 and 393. This direct current voltage via diodes 395 and 396 is via the housekeeping power supply 160 applied without delay to the gates of the normally on transistors 130-133 to bring them to the off state. After stabilization normal PWM operation can resume.

The principle of operation in the example embodiment of FIG. 3 is to slow down the inrush current raised by the shorted devices, before reaching significant levels, to activate the normally on devices, consequently turning them off and interrupting the current. In this example, it is achieved by the addition of inductors in the incoming current path. This way while the inrush current is raising a voltage induced within the secondary inductor is applied to the drivers to turn off the normally on devices. A potential spike cause by the interruption of the circuit is caught by the inductor and fed back into the DC source.

Figure 4:
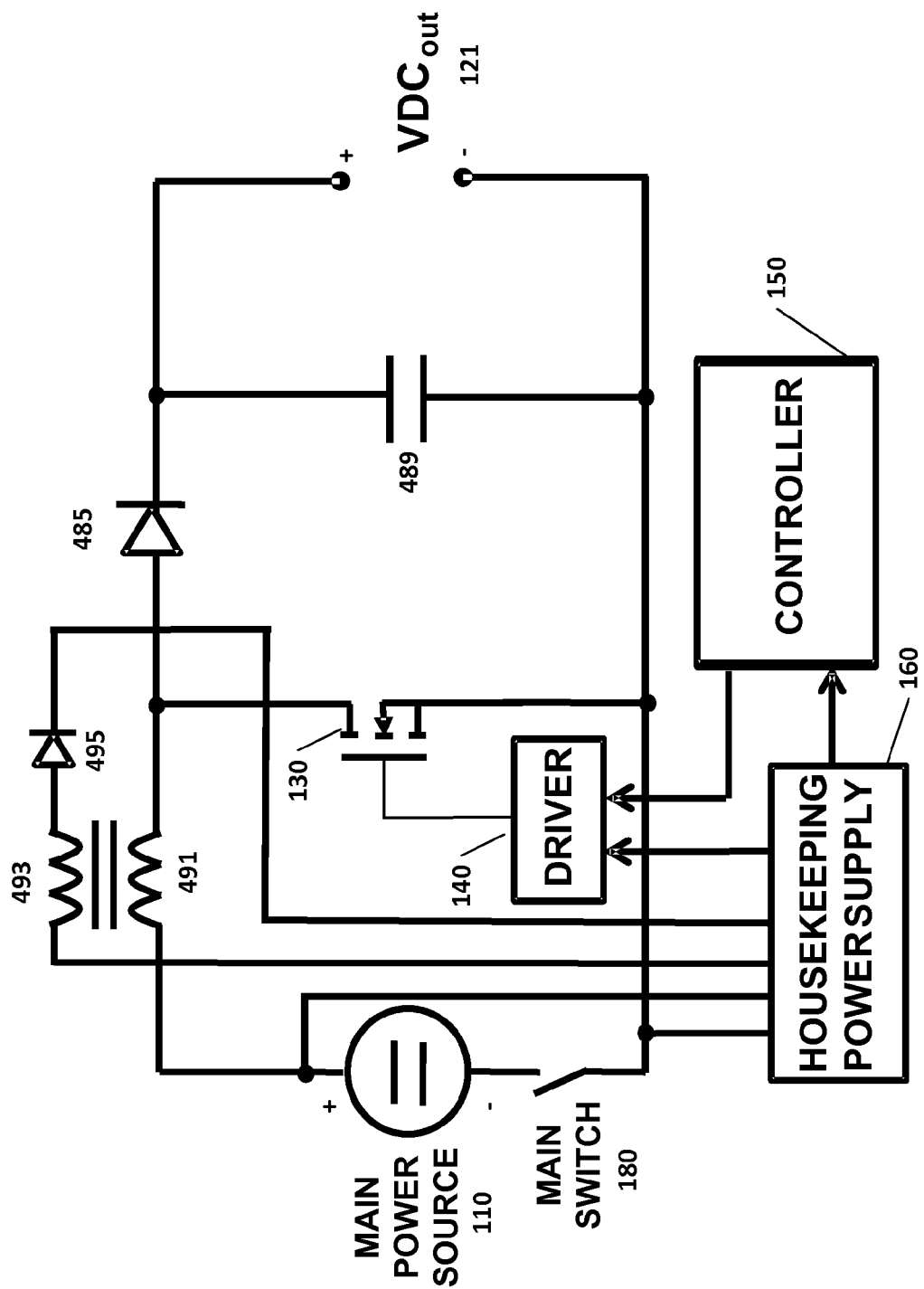
FIG. 4 illustrates a schematic diagram of a normally on transistor switch for a boost power supply according to one embodiment of the present inventions.

Although the example given in FIG. 3 is an H-bridge configuration, almost any topology can accommodate additional inductor along with a secondary inductor. An additional example will be presented in FIG. 4. FIG. 4 will show that an additional inductor is not necessary since the primary inductor takes over this function along with the diode of the boost converter.

The embodiments of FIGS. 3 and 4 slow the current over time dI/dt through the normally on device giving a sufficient time to the drivers to interrupt the increasing current flow. The inductors also provide a quick voltage source for the drivers. An inductor with secondary inductor provides voltage to the drivers and clamps any flyback voltage during turn off.

FIG. 4 illustrates a schematic block diagram of a normally on transistor switch for a boost converter power supply according to one embodiment of the present inventions. The housekeeping power supply 160 is coupled to a permanent or redundant power source such as an in-circuit transformer or inductor 493 to redundantly power the housekeeping power supply 160 separate from the main power source 110. The redundant power source of inductor 493 has primary inductor 491 in series with a respective normally on transistor 130. Secondary inductor 493 is magnetically coupled to the primary inductor 491 and coupled to the housekeeping power supply 160 to redundantly serve as a power source to power the housekeeping power supply 160 and the driver 140 during a transition condition such as a startup of the system. Rectifier diode 495 is in series with the secondary inductor 493 to redundantly provide a DC power source to the housekeeping power supply 160 and the driver 140-143 during transient conditions, such as startup or power down of the system. Power is also made available during irregular operation such as fault conditions.

The boost converter power supply of FIG. 4 has a diode 485 in series between the normally on transistor 130 and the output 121 providing a direct current VDC. A capacitor 489 is provided across the output 121 to smooth the direct current. The controller 150 controls the switching of the normally on transistor 130 in at least a boost switching operation reliant on the primary inductor 495 as an inductor and the diode during operation as a boost converter power supply.

In the boost converter power supply of FIG. 4, an example startup sequence is as follows: First, the main power source 110 is applied (main switch 180 turned on). Second, current starts to flow from the + of the source 110, through the inductor 491, the normally on transistor 130 and the main switch 180 to the negative of the main power source 110 (the normally on transistor 130 is in on state). Third, the current within the primary inductor 491 of a so called transformer-inductor produces a voltage in the secondary inductor 493. This voltage is brought to the housekeeping power supply 160 and applied directly, without delay to the driver 140. Fourth, since the controller 150 has not yet been activated due to delays in the startup sequence and the driver 140 does not yet have any control signal from the controller 150, the driver 140 activates the gate of the normally on transistor 130, interrupting the current between its drain and source. Fifth, in the meantime, the housekeeping power supply 160 went through the startup process and quickly supplied the controller 150 with redundant power. Sixth, the controller 150 is activated by this redundant power and produces the control signal that is supplied to the driver 140; driver 140 accepts it and generates an appropriate modulation switching control for the gate of the normally on transistor 130. Seventh, and finally, when the controller 150 is shut down, the driver 140 takes over the control of the gate of the normally on transistor 130 and keeps control of the gate of the normally on transistor 130 activated until the main power source 110 is removed.

Figure 5:
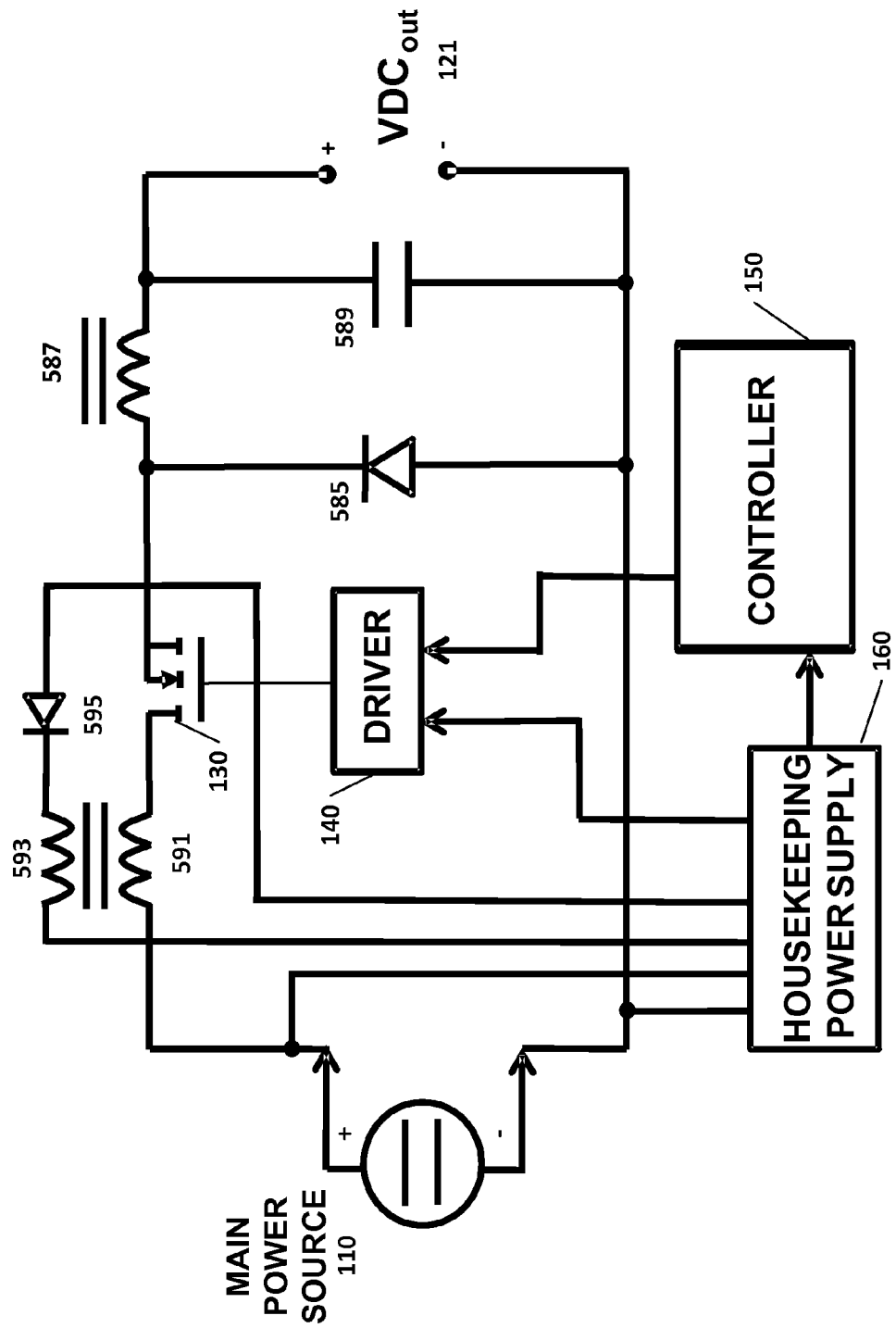
FIG. 5 illustrates a schematic diagram of a normally on transistor switch for a buck power supply according to one embodiment of the present inventions.

FIG. 5 illustrates a schematic block diagram of a normally on transistor switch for a buck power converter supply according to one embodiment of the present inventions. A primary winding or inductor 591 is located as an inductor in series between the main power source 110 and the normally on transistor 130. The housekeeping power supply 160 is coupled to a secondary inductor 593 to redundantly power the housekeeping power supply 160 separate from the main power source 110. Secondary inductor 593 is magnetically coupled to the primary inductor 591 and coupled to the housekeeping power supply 160 to redundantly serve as a power source to power the housekeeping power supply 160 and the driver 140 during a transition condition such as a startup of the system. Rectifier diode 595 is in series with the secondary inductor 593 to redundantly provide a DC power source to the housekeeping power supply 160 and the driver 140-143 during irregular operation, such as transients at startup or power down of the system.

The buck converter power supply of FIG. 5 has a capacitor 589 in parallel with the output 121 to smooth the direct current VDC. An inductor 587 couples the normally on transistor 130 to the output 121 providing a direct current VDC. A diode 585 is provided from a node between the normally on transistor 130 and the inductor 587 to the output 121. The inductor 587 is located between the diode 585 and capacitor 589. The controller 150 controls the switching of the normally on transistor 130 in at least a buck switching operation reliant on the primary inductor 595 as an inductor and the diode during operation as a buck converter power supply.

Figure 6:
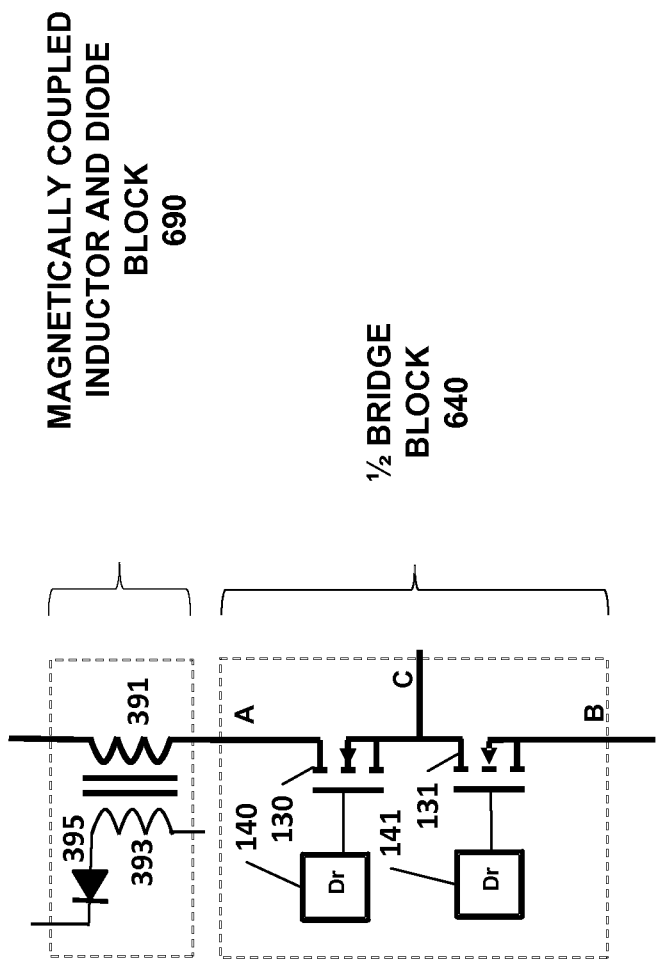
FIG. 6 illustrates a schematic block diagram of two building blocks, two magnetically coupled inductors and a half bridge block, according to embodiments of the present inventions.

FIG. 6 illustrates a schematic block diagram of two building blocks 690 and 640: a magnetically coupled inductor and diode block and a half bridge block, according to embodiments of the present inventions. The block 690 for the magnetically coupled inductor and diode block contains primary inductor 391 and secondary inductor 393 magnetically coupled to the primary inductor 391. The block 640 for the half bridge block contains two serially connected normally on transistors 130 and 131. The block 640 for the half bridge block also contains drivers 140 and 141 coupled to drive the gates of respective normally on transistors 130 and 131. A 'C' connection is at a node between the normally on transistors 130 and 131. An 'A' and a 'B' connection is at respective ends of the two serially connected normally on transistors 130 and 131.

These two building blocks 690 and 640 can comprise a bridge block pair and will be used to construct the exemplary three phase bridge arrangement, H bridge arrangement, half bridge arrangement, synchronous buck converter, synchronous buck-boost converter, and synchronous boost converter of the embodiments of FIGS. 7-10. Any multiple number of bridge block pairs arrangements can be used, so, for example, a six phase supply can be accomplished with six bridge block pairs.

Figure 7:
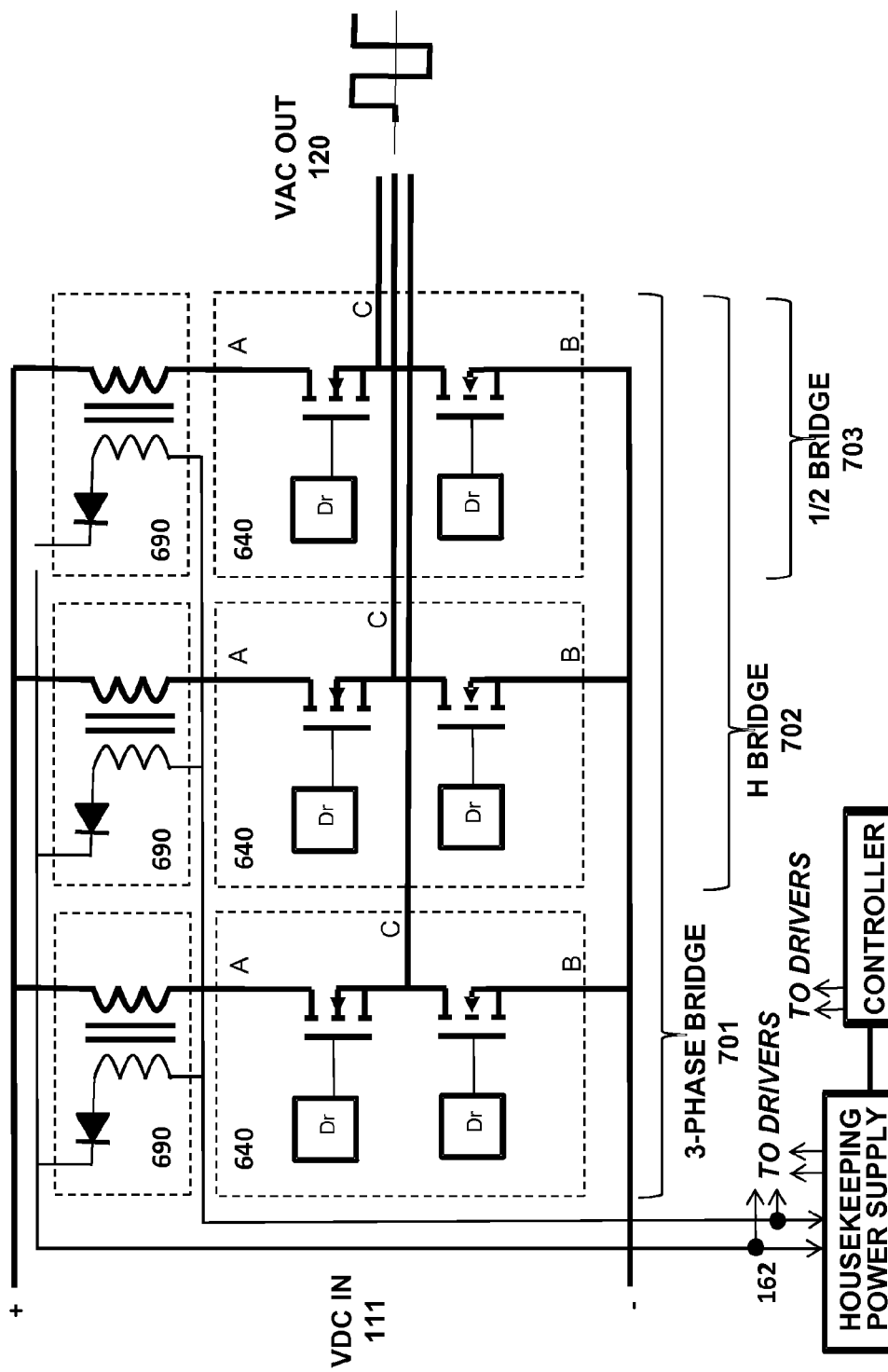
FIG. 7 illustrates a schematic block diagram of the aforesaid building blocks arranged in a three phase, H bridge or half bridge arrangement according to different embodiments of the present inventions.

FIG. 7 illustrates a schematic block diagram of the aforesaid building blocks arranged in a three phase bridge, H bridge or half bridge arrangement according to different embodiments of the present inventions. The circuit arrangement of FIG. 7 converts direct current VDC input 111 to alternating current VAC output 120. Three pairs of the building blocks 690 and 640 are used as depicted to construct a three phase bridge 701. Two pairs of the building blocks 690 and 640 are used as depicted to construct an H bridge 702. One pair of the building blocks 690 and 640 are used as depicted to construct a half bridge 703.

The controller 150 is connected to the drivers of blocks 640 to provide control during regular operation. The housekeeping power supply 160 is connected to block 690 to derive auxiliary power via lines 162 for irregular operation. The housekeeping power supply 160 is also connected to the controller 150 to provide the auxiliary power to the controller 150. In certain constructions the drivers of block 640 can also obtain the auxiliary power via lines 162. In another alternative the drivers of block 640 can obtain auxiliary power from the connection to the housekeeping power supply 160.

Figure 8:
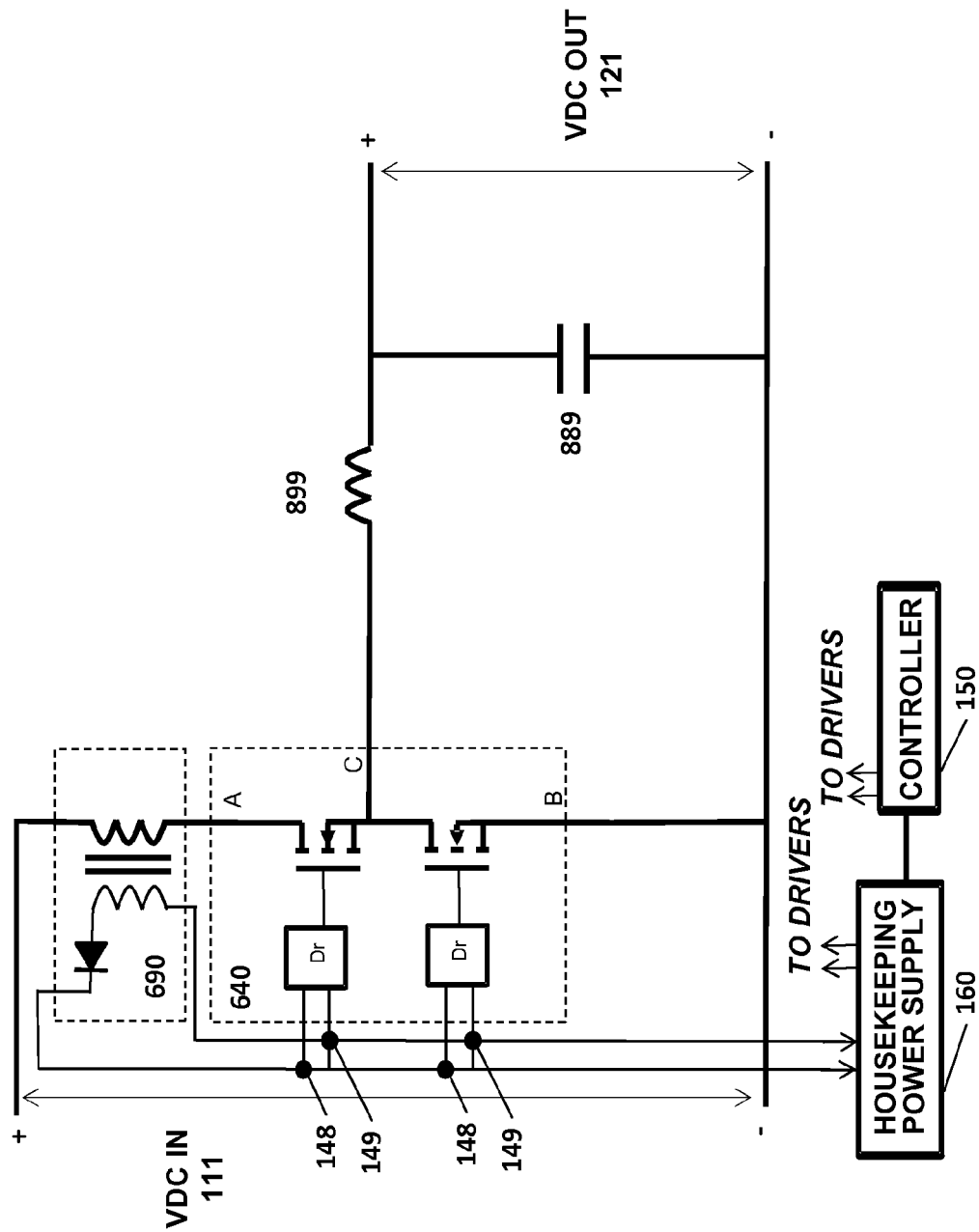
FIG. 8 illustrates a schematic block diagram of the aforesaid building blocks in a synchronous buck converter according to one embodiment of the present inventions.

FIG. 8 illustrates a schematic block diagram of the aforesaid building blocks in a synchronous buck converter according to one embodiment of the present inventions. The circuit arrangement of FIG. 8 converts direct current VDC input 111 to direct current VDC output 121. One pair of the building blocks 690 and 640 are used as depicted to construct a synchronous buck converter together with an inductor coupled between the 'C' connection of the block 640 and the direct current VDC output 121 and a smoothing capacitor 889 across the direct current VDC output 121.

The controller 150 is connected to the drivers of block 640 to provide control during regular operation. The housekeeping power supply 160 is connected to block 690 to derive auxiliary power via lines 162 for irregular operation. The housekeeping power supply 160 is also connected to the controller 150 to provide the auxiliary power to the controller 150. In certain exemplary alternative constructions of other embodiments, the drivers of block 640 can also obtain the auxiliary power via lines connected to nodes 148 and 149. In another exemplary alternative construction of other embodiments, the drivers of block 640 can obtain auxiliary power from the control connection to the housekeeping power supply 160.

Figure 9:
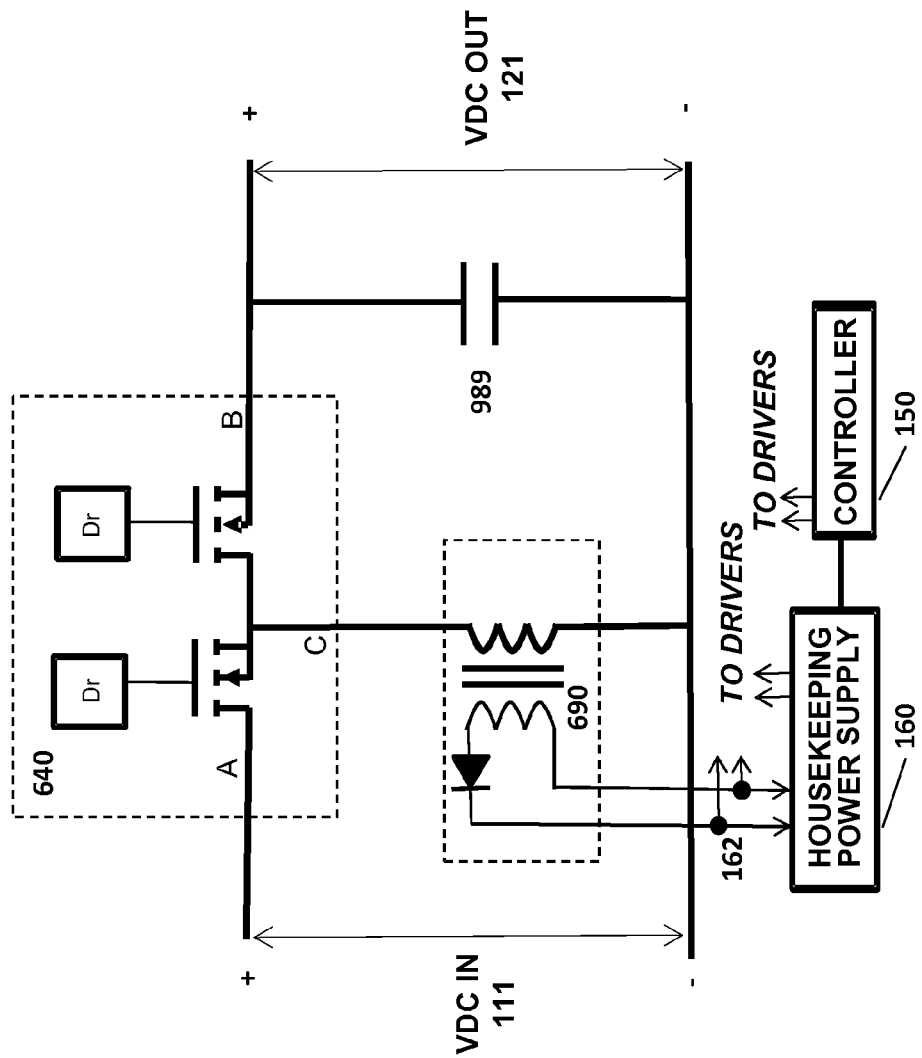
FIG. 9 illustrates a schematic block diagram of the aforesaid building blocks in a synchronous buck-boost converter according to one embodiment of the present inventions.

FIG. 9 illustrates a schematic block diagram of the aforesaid building blocks in a synchronous buck-boost converter according to one embodiment of the present inventions. The circuit arrangement of FIG. 9 converts direct current VDC input 111 to direct current VDC output 121. One pair of the building blocks 690 and 640 are used as depicted to construct a synchronous buck-boost converter together with a smoothing capacitor 989 across the direct current VDC output 121. In this topology no additional inductor is required because the inductors in block 690 both provide auxiliary power and form part of the buck-boost topology.

The controller 150 is connected to the drivers of block 640 to provide control during regular operation. The housekeeping power supply 160 is connected to block 690 to derive auxiliary power via lines 162 for irregular operation. The housekeeping power supply 160 is also connected to the controller 150 to provide the auxiliary power to the controller 150. In certain constructions the drivers of block 640 can also obtain the auxiliary power via lines 162. In another alternative the drivers of block 640 can obtain auxiliary power from the control connection to the housekeeping power supply 160.

Figure 10:
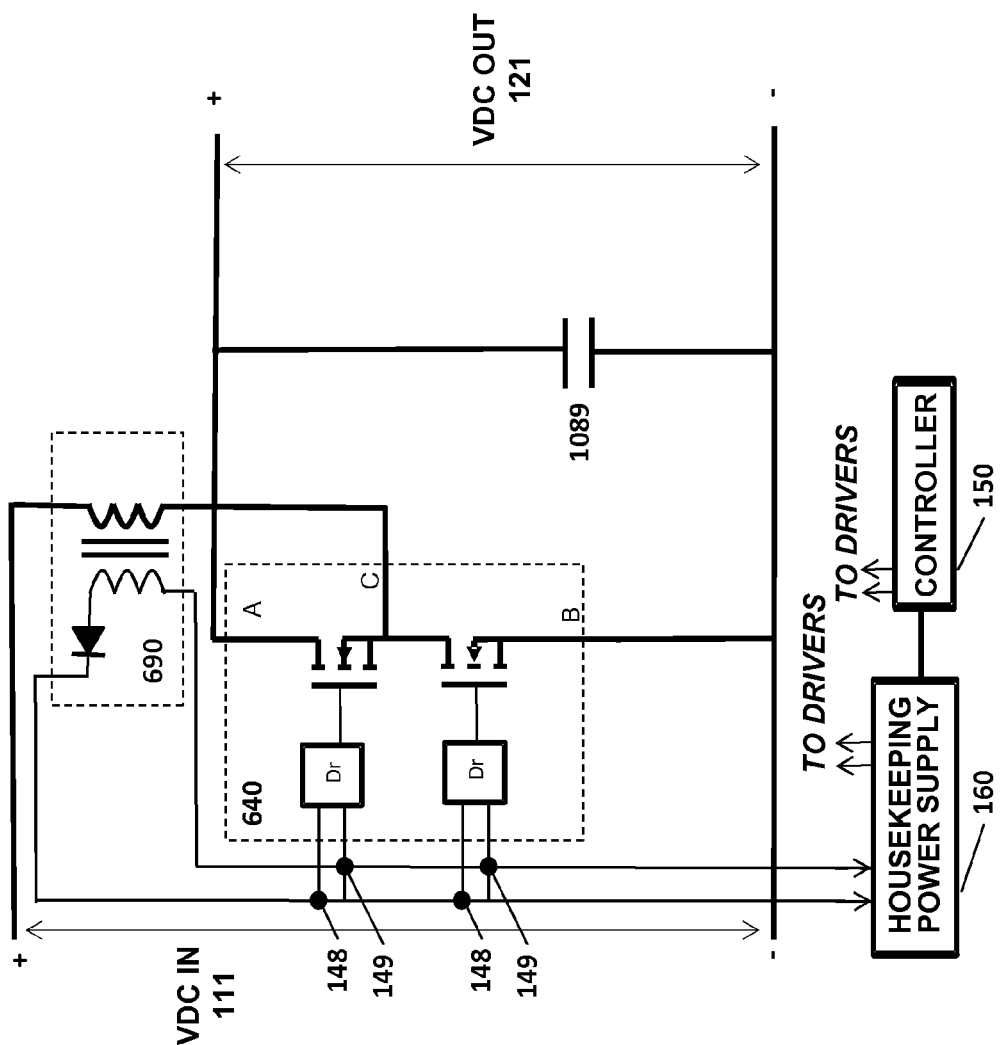
FIG. 10 illustrates a schematic block diagram of the aforesaid building blocks in a synchronous boost converter according to one embodiment of the present inventions.

FIG. 10 illustrates a schematic block diagram of the aforesaid building blocks in a synchronous boost converter according to one embodiment of the present inventions. The circuit arrangement of FIG. 10 converts direct current VDC at 111 to direct current VDC output 121. One pair of the building blocks 690 and 640 are used as depicted to construct a synchronous boost converter together with a smoothing capacitor 1089 across the direct current VDC output 121. In this topology no additional inductor is required because the inductors in block 690 both provide auxiliary power and form part of the boost topology.

The controller 150 is connected to the drivers of block 640 to provide control during regular operation. The housekeeping power supply 160 is connected to block 690 to derive auxiliary power via lines 162 for irregular operation. The housekeeping power supply 160 is also connected to the controller 150 to provide the auxiliary power to the controller 150. In certain constructions the drivers of block 640 can also obtain the auxiliary power via lines connected to nodes 148 and 149. In another alternative the drivers of block 640 can obtain auxiliary power from the control connection to the housekeeping power supply 160.

FIG. 11 illustrates a truth table demonstrating action of the driver according to one embodiment of the present inventions. The circuitry including the auxiliary power or housekeeping power supply 160 allow sufficient sequencing so that the drivers 140 are fully energized before the normally on transistor 130 sees a substantial current. The drivers 140 are built to control the gates of the normally on transistors 130 as depicted depending on the three states of the auxiliary power, the regular power, and the control signal. The auxiliary power is the power delivered by the housekeeping power supply 160. The regular power is the power form the main power source 110. The control signal is the control from the controller 150. While the illustrated columns in the truth table correspond to these three states, each row in the truth table corresponds to an action by the driver 140. One action for the driver 140 to activate the gate of the normally on transistor 130 to turn it off, typically during irregular operation. Another action for the driver 140 is to control the gate of the normally on transistor 130 in accordance with the control signal from the controller 150, typically during regular operation. A '1' in the truth table corresponds to a 'yes' result and a '0' in the truth table corresponds to a 'no' result. In a first truth table combination the gate of the normally on transistor 130 is activated by the driver 140. In a second truth table combination the gate of the normally on transistor 130 is controlled by the driver according to the control signal from the controller 150. In a third truth table combination no action is taken on the gate of the normally on transistor 130 because it is assumed there will not be enough power available to take any action.

Figure 12:
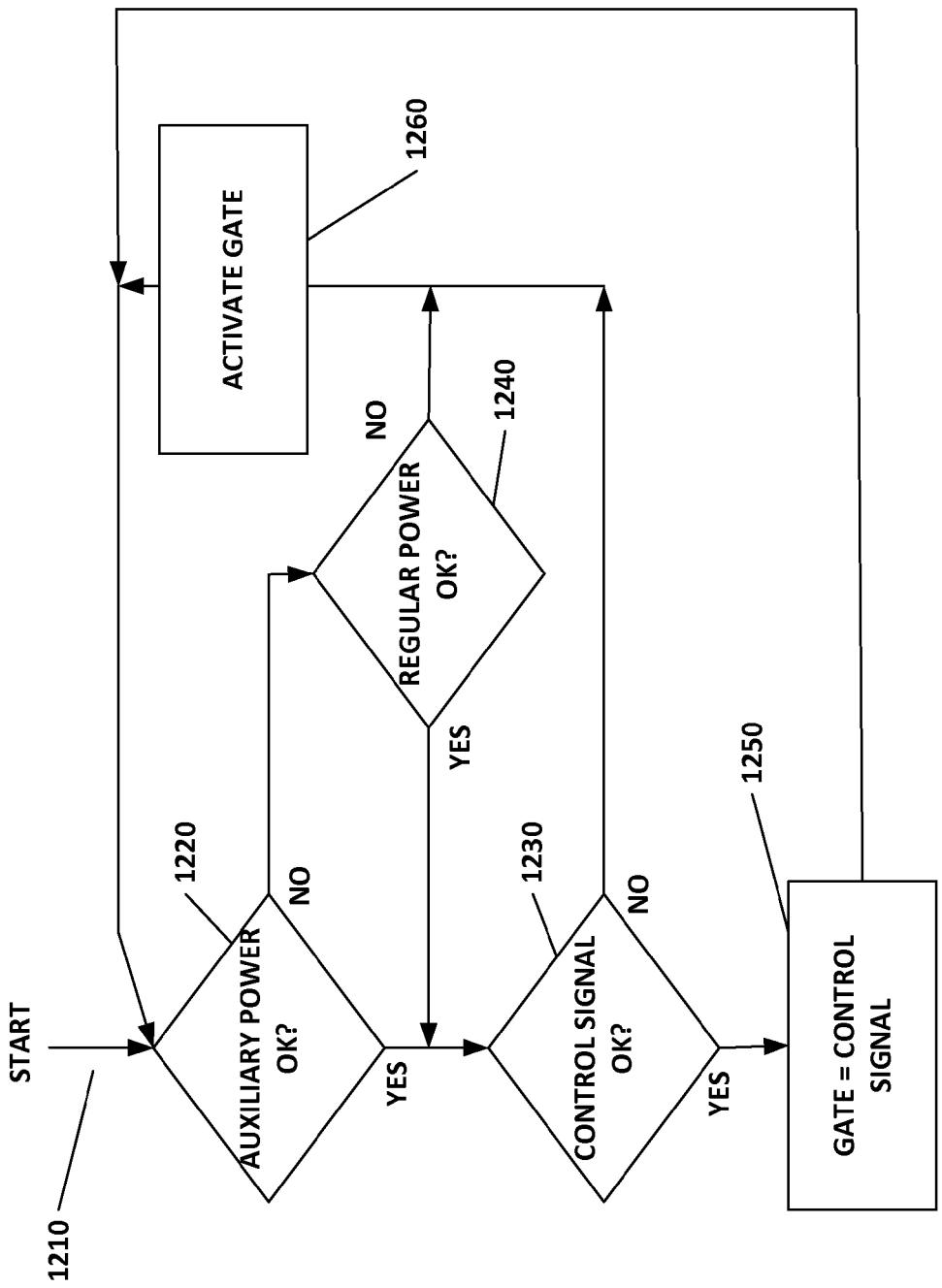
FIG. 12 illustrates a flow chart demonstrating action of the driver according to one embodiment of the present inventions.

FIG. 12 illustrates a flow chart demonstrating action of the driver according to one embodiment of the present inventions. At start 1210 flow goes to decision 1220 where it is decided by the driver 140 whether the auxiliary power is okay. If the auxiliary power from the housekeeping power supply 160 is not okay, flow proceeds to decision block 1240. If decision block decides that the regular power from the main power source 110 is not okay, flow proceeds to block 1260 where the gate of the normally on transistor 130 is activated to switch off the normally on transistor 130. If the auxiliary power from the housekeeping power supply 160 is okay, flow goes to decision block 1230. If the regular power from the main power source 110 is okay, flow goes to the block 1230. If the control signal is not okay, flow proceeds to block 1260 where the gate of the normally on transistor 130 is activated to switch off the normally on transistor 130. If the control signal is okay, in block 1250 the driver 140 control the gate of the normally on transistor 130 using the control signal form the controller 150.

The functionality of a driver for normally off (or open) transistors is to drive the gate of the transistor or IGBT, sometimes also provide some protection features. There is no problem during the time when the control signal is not present; the power device is automatically in off state. In the case of normally on devices, such as a normally on transistor 130 or IGBT, the situation is entirely different. The driver 140 must also assure that the gate of the normally on transistor 130 is or remains activated (keeping the device in off state) whenever the signal from the controller 150 is not present. This feature is particularly important during the transitions (startup and shut down.)

The embodiment s of the aforementioned figures can be made of discrete components or made in a power module with multiple semiconductor devices.

The described principal of adding an inductor electrically coupled with the normally on transistor 130 is applicable to any power electronics topology. During normal operation, the normally on transistor 130 can periodically switch on and off. During transition, when the controller 150 has not yet been, or not any more fully activated, the driver 140 activates the gate of the normally on transistor 130. As a consequence the normally on transistor 130 is off.

Although the invention is described herein with reference to specific embodiments, various modifications and changes can be made without departing from the scope of the present invention as set forth in the claims below. For example, normal operation can include PWM, FM, PDM, etc. Accordingly, the specification and figures are to be regarded in an illustrative rather than a restrictive sense, and all such modifications are intended to be included within the scope of the present invention. The drivers and auxiliary power and inductors can have different configurations than the examples illustrated in the drawings. Any benefits, advantages, or solutions to problems that are described herein with regard to specific embodiments are not intended to be construed as a critical, required, or essential feature or element of any or all the claims.

Any letter designations such as (a) or (b) etc. used to label steps of any method claims are step headers applied for reading convenience and are not to be used in interpreting an order or process sequence of claimed method steps. Any method claims that recite a particular order or process sequence will do so using the words of their text, not the letter designations.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A power source, comprising:
   a main power source;
   a normally on transistor including a first electrode connected to the main power source, a second electrode to provide a power output of the power source, and a control electrode;
   a driver including a first input, a second input and a control output connected to the control electrode to switch the normally on transistor;
   a controller including a signal output connected to the first input to deliver a control signal to the driver to switch the normally on transistor between an on state and an off state to provide the power output on the signal electrode during regular operation; and
   a housekeeping power supply including an auxiliary power output connected to the second input to switch the normally on transistor to the off state and to maintain the normally on transistor in the off state to turn off the power output on the second electrode during irregular operation.

2. The power source according to claim 1, wherein the irregular operation occurs when the control signal is absent.

3. The power source according to claim 1, further comprising a capacitor including a third electrode connected to the second electrode.

4. The power source according to claim 1, wherein the irregular operation occurs during transients of power up and power down of the main power source.

5. The power source according to claim 1, wherein the housekeeping power supply further includes an input connected to the main power source to power the housekeeping power supply.

6. The power source according to claim 1, wherein the housekeeping power supply further includes an input connected to a redundant power source to power the housekeeping power supply.

7. The power source according to claim 6, further comprising a primary inductor coupled in the power source; and wherein the redundant power source comprises a secondary inductor magnetically coupled to the primary inductor to power the housekeeping power supply.

8. The power source according to claim 6, wherein the redundant power source comprises a battery separate from the main power source.

9. The power source according to claim 6, wherein the redundant power source comprises a supercapacitor separate from the main power source.

10. The power source according to claim 1, further comprising a bridge block pair comprising a pair of a first block and a second block;
    wherein the first block comprises a primary inductor, a secondary inductor for at least the housekeeping power supply magnetically coupled to the primary inductor and a diode coupled to the secondary inductor to deliver the auxiliary power;
    wherein the second block comprises at least the normally on transistor and a second normally on transistor operatively coupled with each other; and
    wherein the second block comprises at least the driver and a second driver, each of said drivers coupled to the gate of a corresponding normally on transistor, the housekeeping power supply, and the controller.

11. The power source according to claim 10, wherein the bridge block pair is arranged to form a half bridge power switch.

12. The power source according to claim 10, wherein two bridge block pairs are arranged to form an H bridge switch.

13. The power source according to claim 10, wherein three bridge block pairs are arranged to form a multi-phase bridge switch comprising three or more bridge block pairs.

14. The power source according to claim 10, wherein the bridge block pair is arranged to form a power supply chosen from the group consisting of a buck converter, buck-boost converter, and boost converter.

15. The power source according to claim 6, wherein the redundant power source comprises:
   a primary inductor in series with the normally on transistor;
   wherein the redundant power source further comprises a secondary inductor magnetically coupled to the primary inductor to redundantly serve as a first power source to power the driver during a transition condition such as a startup of the system; and
   wherein the redundant power source further comprises at least one rectifier diode coupled to the secondary inductor to redundantly provide a DC power source to the driver during the transients, wherein the transients occur during power up and power down of the main power source.

16. The power source according to claim 15,
   wherein the primary inductor is located as an inductor in series between the main power source and the normally on transistor;
   wherein the first power supply further comprises a diode in series between the normally on transistor and the output; and
   wherein the controller controls the switch off of the normally on transistor in at least a boost switching operation reliant on the primary inductor as the inductor and the diode during operation as a boost power supply.

17. The power source according to claim 15,
   wherein the primary inductor is located as an inductor in series between the main power source and the normally on transistor;
   wherein the first power source further comprises a diode in parallel with the output; and
   wherein the controller controls the switching of the normally on transistor in at least a buck switching operation reliant on the primary inductor as an inductor and the diode during operation as a buck power supply.

18. The power source according to claim 1, further comprising a main switch operatively coupled in series with the main power source and operatively coupled to the controller for disconnecting the main power source upon a fault condition.

19. The power source according to claim 1, wherein the normally on transistor is chosen from the group consisting of SiC, GaN and diamond semiconductors.

20. A method, comprising:
   connecting a first electrode of a transistor of a power supply to a main power source of the power supply, wherein the transistor is a normally-on transistor;
   connecting a second electrode of the transistor to an output of the power supply to provide a power output;
   connecting a control output of a driver of the power supply to a control electrode of the transistor, the control output to switch the transistor;
   connecting a signal output of a controller of the power supply to a first input of the driver, the signal output to direct the driver to switch the transistor between an on state and an off state to provide the power output on the second electrode during regular operation; and
   connecting an auxiliary power output of a housekeeping power supply to a second input of the driver, the auxiliary power output to switch the normally on transistor to the off state and to maintain the normally on transistor in the off state to turn off the power output on the signal electrode during irregular operation.

* * * * *